United States Patent [19]
Rantala et al.

[11] Patent Number: 5,152,052
[45] Date of Patent: Oct. 6, 1992

[54] PRINTED CIRCUIT BOARD REMOVAL TOOL

[75] Inventors: William S. Rantala; Gregory C. Franke; Ismael A. Rodriguez, all of Houston, Tex.

[73] Assignee: Compaq Computer Corporation, Houston, Tex.

[21] Appl. No.: 721,195

[22] Filed: Jun. 26, 1991

[51] Int. Cl.5 .................. H05K 13/04; H05K 3/30
[52] U.S. Cl. .................................. 29/764; 29/267; 29/278
[58] Field of Search ............... 29/426.5, 426.1, 762, 29/764, 739, 741, 758, 267, 270, 278

[56] References Cited
U.S. PATENT DOCUMENTS

| | | | |
|---|---|---|---|
| 3,443,297 | 5/1969 | Lusby, Jr. ............... | 29/764 |
| 4,152,827 | 5/1979 | Walton, II ............... | 29/764 |
| 4,503,287 | 4/1986 | McDevitt et al. ........ | 29/764 X |
| 4,615,110 | 10/1986 | Crone ..................... | 29/764 X |
| 4,721,029 | 1/1988 | Hoffman et al. .......... | 91/520 |
| 4,821,959 | 6/1985 | Sprenkle .................. | 29/764 X |
| 4,970,779 | 11/1990 | Chen ...................... | 29/764 |

FOREIGN PATENT DOCUMENTS

| | | | |
|---|---|---|---|
| 2745966 | 4/1979 | Fed. Rep. of Germany ........ | 29/764 |
| 2813481 | 7/1979 | Fed. Rep. of Germany ........ | 29/764 |

Primary Examiner—Timothy V. Eley
Attorney, Agent, or Firm—Konneker & Bush

[57] ABSTRACT

A hand operable tool is provided for removing a memory module printed circuit board from an underlying processor board without an appreciable risk of bending the pins of the pin-and-socket connectors used to removably secure the circuit board to the processor board. The tool comprises a generally inverted U-shaped outer frame structure having a pair of parallel, inturned bottom pressure plates secured to its lower ends. A shorter, generally inverted U-shaped inner frame structure is slidably retained within the outer frame structure and has a pair of parallel, inturned upper pressure plates secured to its lower ends. The inner frame structure is spring-biased to a lower limit position in which the upper pressure plates engage the bottom pressure plates, and a pair of elongated upper and lower handle members are connected to the frame structures. To remove the circuit board, the pressure plates are positioned beneath opposite underside edge portions of the board and the tool handles are vertically squeezed toward one another to vertically separate the upper pressure plates from the bottom pressure plates. This causes the bottom pressure plates to bear against the processor board, and the upper pressure plates to simultaneously bear against the underside edge portions of the circuit board and vertically lift them to remove the circuit board without bending its associated connector pins.

2 Claims, 3 Drawing Sheets

PRINTED CIRCUIT BOARD REMOVAL TOOL

BACKGROUND OF THE INVENTION

1. Field of the Invention

The present invention relates generally to printed circuit board apparatus, and more particularly relates to apparatus and methods for removing a printed circuit board device, such as a memory module, from an underlying processor board to which it is removably attached by means of pin-and-socket type connector structure.

2. Description of Related Art

In constructing a personal computer, it is customary to removably attach the computer's printed circuit board memory modules to an underlying processor board using connector structures comprising a spaced plurality of male connector portions secured to and projecting upwardly from the top side of the processor board, and a spaced plurality of female connector portions secured to and projecting downwardly from the underside of the memory module's printed circuit board portion. Operative electrical interconnection between the memory module and the circuitry of the underlying processor board (or "motherboard") is achieved by means of a spaced series of metal pins projecting upwardly from the male connector portions and tightly but removably received in sockets formed in the undersides of their female connector portion counterparts.

From time to time it becomes necessary to remove these memory modules and replace them with new ones. A long standing problem associated with such removal is the possibility of bending the male connector portion pins in doing so. Even a slight amount of bending of these pins can cause several subsequent problems.

For example, if the pins are bent during the memory module removal process they can damage the sockets of the new female connector portions into which they are subsequently inserted when the removed memory module is replaced. Such damage can, and often does, create intermittent or permanent circuitry disruption at the locations of the pin-damaged connection sockets. Alternatively, one or more of the male connector portion pins can be broken, or so badly bent that it cannot be subsequently inserted in its associated connection socket.

This pin damage arises from well known deficiencies in conventional tools used to remove the memory modules, as well as other types of printed circuit boards, from structures that they are attached to by mating pin-and-socket type connector components. For example, one type of tool commonly used for this circuit board removal purpose—typically referred to as a "spatula"—is basically an elongated implement used prybar-like to alternately force opposite side edges of the memory module a bit further away from the underlying processor board until the connector pins are freed from their associated receiving sockets. The spatula thus imparts a side-to-side rocking motion to the memory module as the female connector portions are forced upwardly along the male connector portion pins. This rocking motion, of course, imparts transverse forces to the connector pins which, if considerable care is not taken, can easily bend the pins.

Various plier-type devices are also customarily utilized to remove memory circuit boards by alternately gripping and slightly lifting opposite side edge portions of a particular circuit board until the connector pins are freed from their sockets. This also tends to create a side-to-side rocking motion of the circuit board which undesirably imposed transverse bending forces on the connector pins. Also, like their spatula tool counterparts, these piler-like board removal tools can easily damage integrated circuit components secured to the inner side of the circuit board adjacent the side edge portions thereof forcibly engaged by the board removal tool.

It can readily be seen from the foregoing that a need exists for a circuit board removal tool which substantially lessens the risk of connector pin damage associated with board removal. It is accordingly an object of the present invention to provide such a tool.

SUMMARY OF THE INVENTION

The present invention provides an improved tool for removing a rectangular printed circuit board, such as the printed circuit board used in a computer memory module, from an underlying processor board removably secured to the printed circuit board by means of a pin-and-socket type connector structures. From a broad perspective, the improved tool of the present invention comprises first engagement means for simultaneously engaging opposite first and second underside edge portions of the printed circuit board along at least major portions of their lengths; second engagement means for engaging first and second side surface portions of the processor board which underlie the underside edge portions of the printed circuit board; and third means operable to force the first and second engagement means apart from one another, in a direction essentially parallel to the connector pins.

In this manner, the tool is operative to move the printed circuit board outwardly away from the underlying processor board, and effect its disconnection therefrom, without imposing any appreciable transverse bending forces on the connector pins. Because the first engagement means are operative to engage the opposite underside edge portions of the printed circuit board along at least major portions of their lengths, and exert simultaneous lifting forces thereon, point contact forces on the circuit board are avoided, and the pin-bending "rocking" removal motion imparted to the circuit by conventional removal tools is essentially eliminated. The improved tool may accordingly be used without an appreciable risk of bending the critical connector pins.

In a preferred embodiment of the circuit board removal tool, the first engagement means comprise a pair of elongated parallel first pressure plates that define inturned bottom lip portions of a generally inverted U-shaped inner frame structure configured to receive the printed circuit board with the lip portions underlying the opposite underside edge portions thereof. The second engagement means comprise a pair of elongated parallel second pressure plates that define inturned bottom lip portions of a generally inverted U-shaped outer frame structure in which the inner frame structure is nestingly received.

The inner frame structure is movable relative to the outer frame structure between a lowered position in which the inturned lip portions of the inner and outer frame structures abut one another, and a lifted position in which the inner frame structure lip portions are lifted above the outer frame structure lip portions. Spring means are provided for resiliently biasing the inner frame structure toward its lowered position, and handle means are connected to the inner and outer frame structures. The handle means are manually operable to forcibly and releasably move the inner frame structure to its lifted position.

With the printed circuit board operatively received within the inner frame structure, the handle means are operated to force the inturned lip portions of the inner and outer frame structures respectively against the underside edge portions of the circuit board and against the processor board to thereby force the circuit board away from the underlying processor board in a direction essentially parallel to the connector pins.

DETAILED DESCRIPTION

Figure 1:
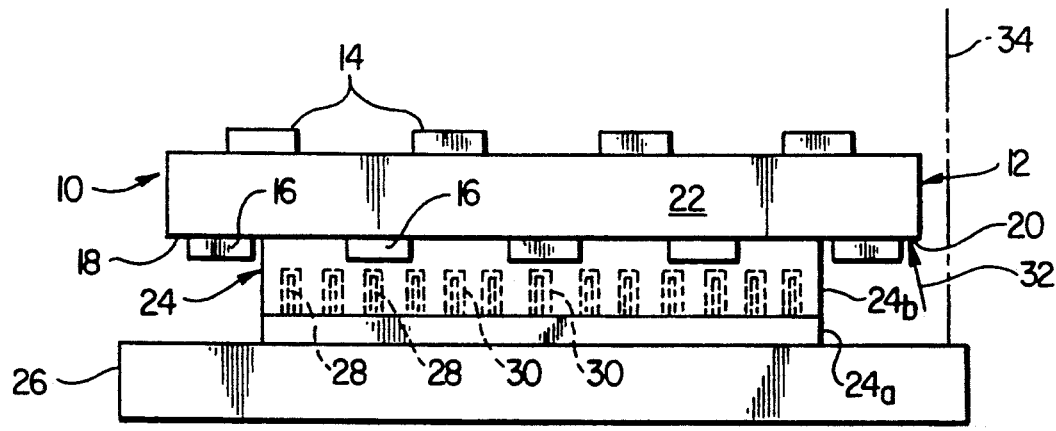
FIG. 1 (Prior Art) is a simplified end elevational view of a conventional printed circuit board memory module removably connected to an underlying processor board by a pin-and-socket type connector structure.

Elevationally depicted in FIG. 1 (Prior Art), in a somewhat simplified manner, is a conventional printed circuit board device representatively in the form of a memory module 10 typically installed in a personal computer. Memory module 10 includes a rectangular printed circuit board 12 having spaced series of integrated circuit devices 14,16 respectively mounted on its upper and lower side surfaces, a pair of opposite underside edge surface portions 18,20 positioned outwardly of the bottom integrated circuit devices 16, and a front end edge surface 22.

A plurality of pin-and-socket type connector structures 24 (only one of which is visible in FIG. 1) are spaced apart in a front-to-rear direction along the bottom side of the circuit board 12. The connector structures 24 are used to removably mount the circuit board 12 on a processor board 26, in an upwardly spaced, parallel relationship therewith. Each connector structure 24 includes a male portion $24_a$ secured to the top side of the processor board 26 and having a spaced series of upwardly projecting metal connection pins 28, and a female portion $24_b$ secured to the underside of the circuit board 12. The pins 28 are tightly but removably received in corresponding sockets 30 formed in the bottom side of connector portion $24_b$.

Figure 2:
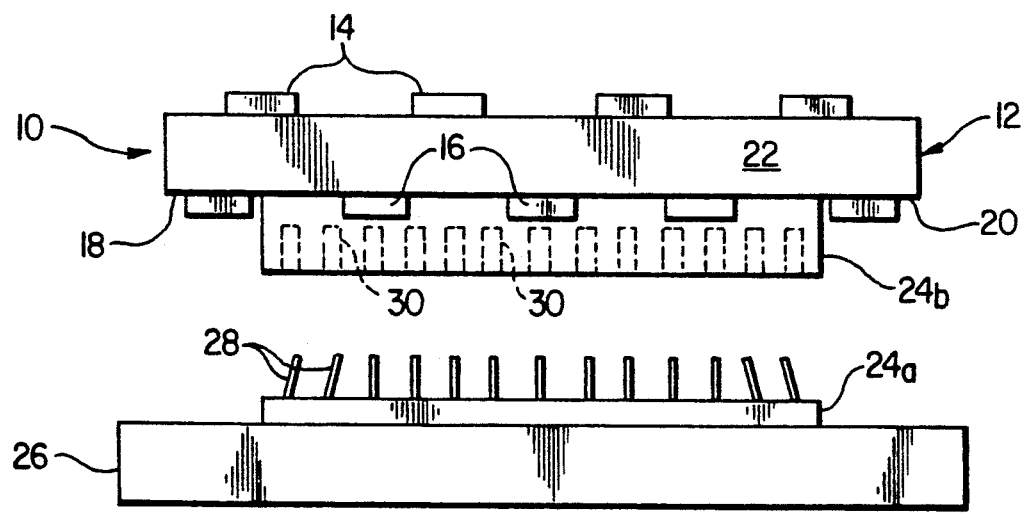
FIG. 2 (Prior Art) is a view similar to that in FIG. 1, but with the memory module removed, and illustrates in exaggerated form the connector pin damage that can occur when a conventional tool is used to remove the memory module.

When it becomes necessary to remove the memory module 10 from the underlying processor board 26, the circuit board 12 is typically pried upwardly apart from the processor board 26 using a conventional board removal tool, such as an elongated "spatula", to disengage the pins 28 from their associated sockets 30 as shown in FIG. 2 (Prior Art). An inner end of the spatula is positioned beneath one of the underside edge portions 18,20 of the circuit board 12 and levered against the top side of the processor board 26 to upwardly pry a side edge of the circuit board 12 a slight distance further away from the top of the processor board. The spatula prying force is alternately applied to the underside edge portions 18,20 until the pins 28 are freed from their sockets 30.

As indicated by the arrow 32 in FIG. 1, the prying force tends to be vertically canted away from a vertical line 34 transverse to the processor board 26. Accordingly, if care is not exercised, a substantial transverse force can be transmitted to the pins 28, causing them to bend as illustrated in exaggerated form in FIG. 2. It should be noted that this pin bending can occur even if the prying force 32 exerted on a single underside edge portion of the circuit board is vertically directed. This is because the alternating prying forces imposed on opposite side edges of the circuit board, even if vertically directed, cause side-to-side "rocking" of the female connector portion $24_b$ as it is forced upwardly along the pins 28.

Once the pins 28 are bent in this manner, several problems can subsequently occur when the female connector portions of a new memory module are connected to the male connector portions $24_a$. For example, the bent pins can easily damage the new sockets, thereby creating intermittent or permanent circuitry interruptions at various of the pin/socket interfaces. Additionally, the pins are sometimes bent to an extent that they are broken or will not enter the new sockets.

Various plier-type tools are also conventionally used to remove the circuit board 12 from the underlying processor board by alternately gripping and lifting opposite side edge portions of the circuit board. This also tends to impart a pin-bending rocking movement to the board as it is removed from the pins 28. Additionally, as in the case of the spatula, board removal pliers impose concentrated forces on the very limited portions of the board side edges which they engage. If care is not exercised, this can easily damage one or more or the integrated circuit devices positioned adjacent such side edge portion.

Referring now to FIGS. 3–5B, the present invention provides a specifically designed circuit board removal tool 40 which substantially eliminates these problems associated with conventional board removal tools such as those described above. Tool 40 has an outer frame structure that includes an elongated rectangular upper support plate 42 with a pair of vertical outer side plates 44,46 secured to and depending from its opposite ends. A pair of thinner horizontal bottom pressure plates 48,50 are secured to the bottom edges of vertical plates 44,46 and laterally project inwardly beyond their facing side surfaces.

Figure 4:
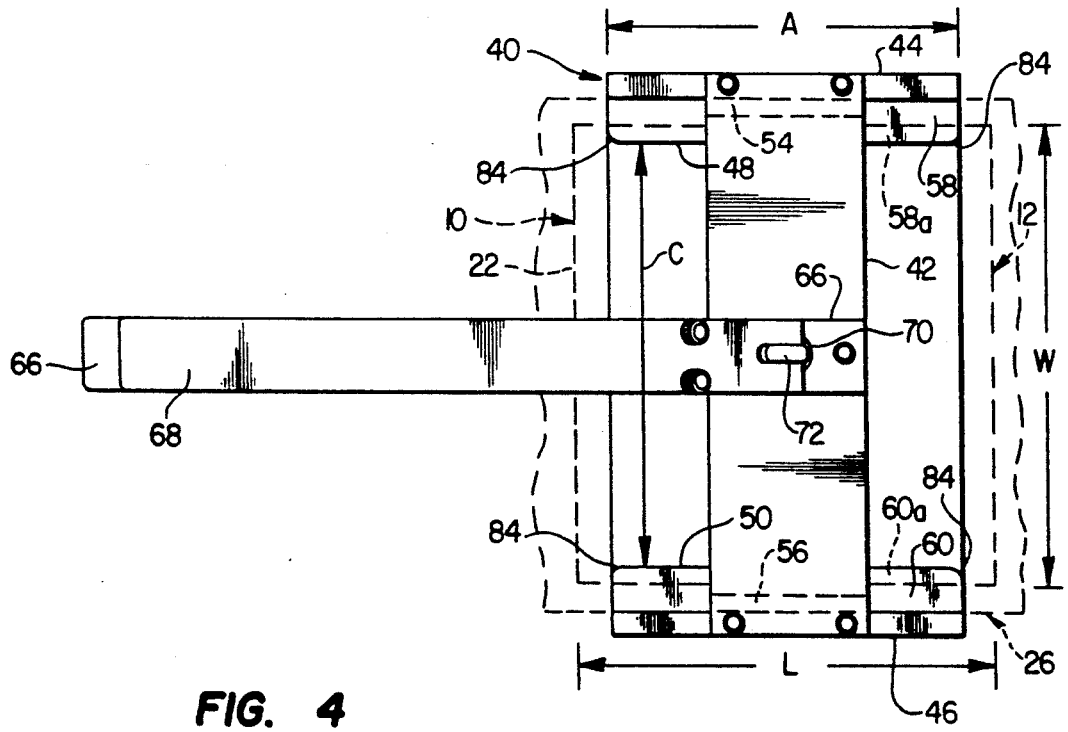
FIG. 4 is a top plan view of the tool.
Figure 5A:
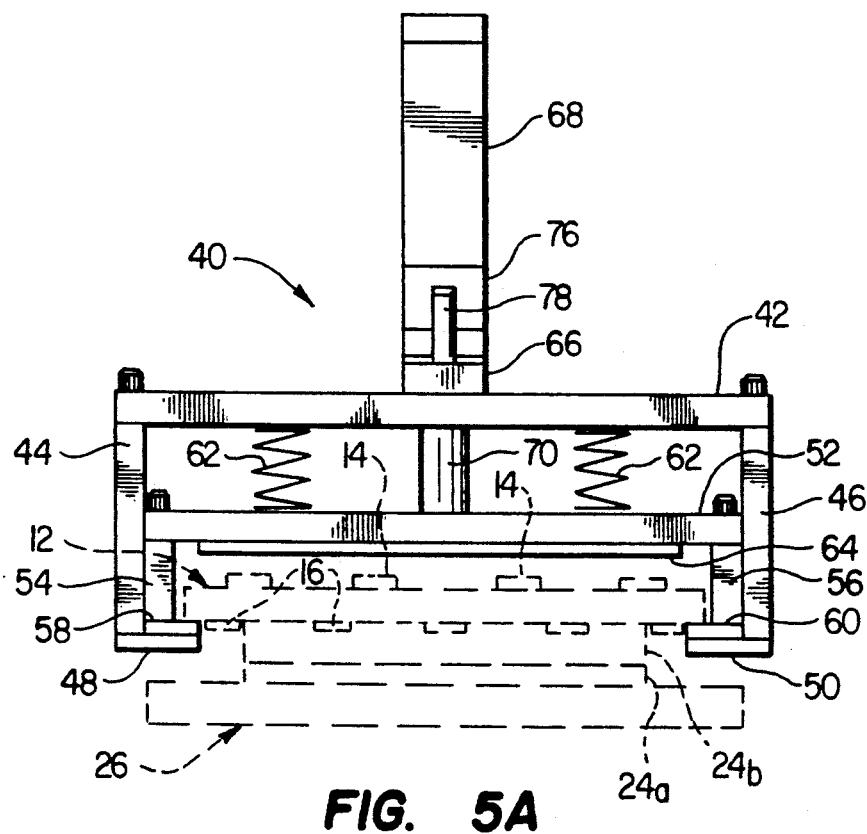
FIGS. 5A and 5B are left end elevational views of the tool sequentially illustrating its use in removing the memory module from the underlying processor board.

Spaced downwardly apart from the upper support plate 42, in a parallel relationship therewith, is an elongated rectangular lower support plate 52 which forms a portion of an inner frame structure and longitudinally extends between the facing vertical side surfaces of the outer side plates 44,46. A pair of vertical inner side plates 54,56 are secured to and depend from the opposite ends of the upper support plate 42 and are respectively positioned inwardly adjacent the outer side plates 44,46. Respectively secured to the bottom edges of inner side plates 54,56 are a pair of thinner upper pressure plates 58,60 which overlie and are downwardly engageable with the bottom pressure plates 48,50. As illustrated in FIGS. 4 and 5A, the upper pressure plates 58 and 60 have side edge portions $58_a$ and $60_b$ which horizontally project inwardly beyond the inner side surfaces of the vertical plates 54,56.

The vertical widths of the inner side plates 54,56 are shorter than those of the outer side plates 44,46. Accordingly, with the upper pressure plates 58,60 engaging the bottom pressure plates 48,50 as shown in FIG. 5A, the lower support plate 52 is spaced downwardly apart from the upper support plate 42. Lower support plate 52 is resiliently biased toward this lower limit position by means of a spaced pair of cylindrical compression spring members 62 bearing at their opposite ends against the bottom side of plate 42 and the top side of plate 52. For purposes later described, a resilient pad member 64 is suitably secured to the underside of the lower support plate 52.

The inner end of an elongated lower handle member 66 is fixedly secured to a central top side portion of the upper support plate 42 directly beneath an elongated upper handle member 68. A cylindrical vertical actuating shaft 70, having a flattened upper end portion 72, is slidably extended downwardly through aligned circular openings formed through the upper support plate 42 and the inner end of handle member 66, and is fixedly secured at its lower end to the lower support plate 52.

Figure 3:
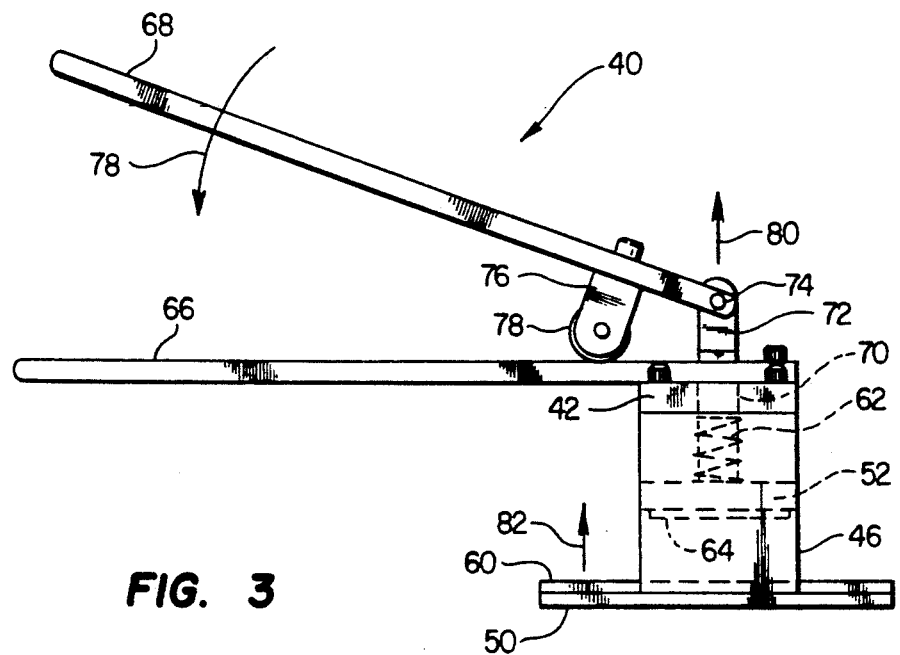
FIG. 3 is a side elevational view of an improved circuit board removal tool embodying principles of the present invention.

The inner end of the upper handle member 68 has a central slot (see FIG. 4) that upwardly receives the flattened upper end 72 of the vertical actuating rod 70. As best illustrated in FIG. 3, the inner end of the upper handle member 68 is pivotally secured to the rod portion 72 by a pivot pin 74. A mounting bracket 76 is secured to the underside of the upper handle member 68, adjacent its inner end, and supports a roller 78 that rollingly engages the top side of the lower handle member 78 adjacent its inner end.

When the handle members 66, 68 are gripped and vertically squeezed together as indicated by the arrow 78 in FIG. 3, the actuating shaft 70, and thus the lower support plate 52 and the upper pressure plate 60, are lifted upwardly relative to the bottom pressure plate 50 (against the resilient resistance of the springs 62) as indicated by the arrows 80, 82 in FIG. 3. Release of the handle members 66,68 permits springs 62 to downwardly return the lower support plate 52 (and thus the inner frame structure) to its lower limit position, shown in FIGS. 3 and 5A, in which the upper pressure plate 60 bottoms out against the lower pressure plate 50.

Referring now to FIGS. 4 and 5A, memory module circuit boards such as board 12 have a standard width W (FIG. 4), and a length L which varies from about 1.5" to about 5". To provide the tool 40 with a universal configuration, thereby adapting it for use in removing any standard memory module circuit board within this length range, the length A of each of the upper pressure plates 58,60 is approximately 3.5"—i.e., about 70 percent of the maximum board length. The distance B (FIG. 5A) between the inner side plates 54,56 is made just slightly larger than the standard board width W, and the distance C (FIG. 4) between the horizontally inner side edges of the upper pressure plates 58,60 is made somewhat smaller than the width W.

To remove the memory module 10 from the underlying processor board 26, the inwardly projecting side edge portions 58$_a$ and 60$_b$ of the upper pressure plates 58,60 are respectively positioned beneath and parallel to the underside edge portions 18,20 of the circuit board 12 (see FIG. 1), with the bottom pressure plates 48,50 positioned above the top side of the processor board 26 as shown in FIGS. 4 and 5A. During placement of the tool in this manner, the resilient pad 64 protects the upper integrated circuit devices 14 against damage by the lower support plate 52.

Figure 5B:
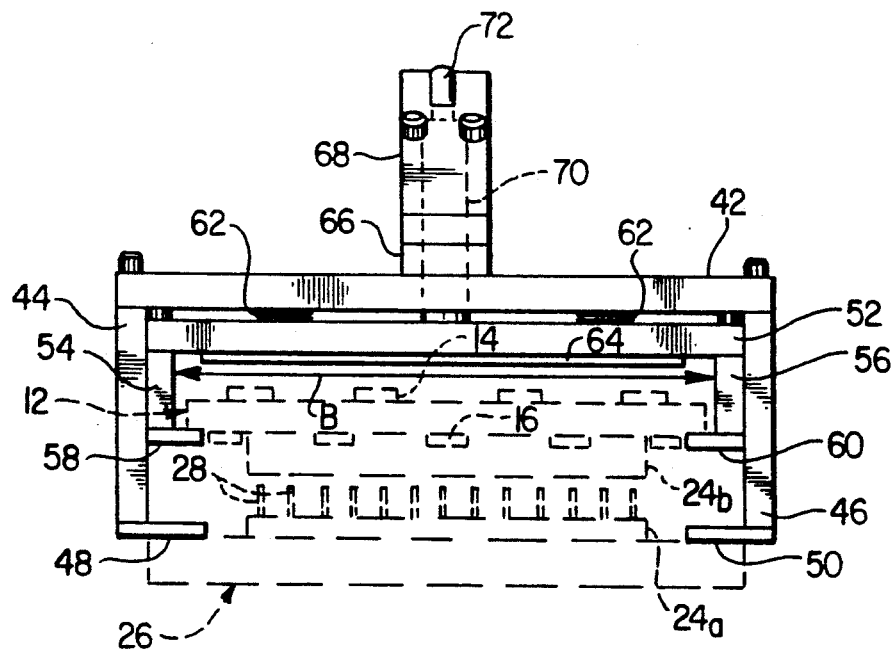

The tool handles 66, 68 are then squeezed together to vertically separate the upper and lower pressure plates until the side edge portions 58$_a$, 60$_a$ of the upper pressure plates 58,60 respectively engage the underside edge portions 18,20 of the circuit board 12, and the bottom pressure plates 48,50 engage the top side of the processor board 26. As illustrated in FIG. 5B, the tool handles 66,68 are then further squeezed together to lift the upper pressure plate side edge portions 58$_a$, 60$_a$ relative to the bottom pressure plates 48,50 bearing upon the processor board 26 to force the circuit board 12 upwardly apart from the processor board 26 and vertically separate the female connector portions 24$_b$ from the male connector portions 24$_a$.

Importantly, the lifting force exerted in this manner on the circuit board 12 by the tool 40 is essentially vertical, and is simultaneously exerted on opposite side edge portions of the circuit board along at least major portions of their lengths (depending on the length L of the board being removed by the tool). This essentially eliminates the risk of bending the pins 28 during the board removal process.

Additionally, since the vertical removal force exerted on the circuit board 12 by the tool 40 is spread out along at least major portions of the lengths of the board underside edge portions 18 and 20, the concentrated point contact forces associated with conventional board removal tools such as spatulas and pliers are also eliminated. This, in turn, greatly reduces the risk that any of the integrated circuit devices 16 mounted on the underside of the board 12 will be damaged during the board removal process. To further ensure that these integrated circuit devices will not damaged, the horizontally inner corners of the upper and bottom pressure plates are radiused as at 84 (FIG. 4), and the side edges of these pressure plates are also appropriately radiused.

The tool 40 is of a simple and quite inexpensive construction, is easy to use, and advantageously permits the circuit board to be removed, as described above, without an appreciable risk of bending the connector pins or damaging any of the integrated circuit devices mounted on the board. Also as described above, the tool is advantageously provided with a universal configuration which permits it to be used with any standard width memory module printed circuit board. The principles incorporated in the improved tool 40 may also, of course, be utilized in the removal of other types of printed circuit boards operatively associated with pin-and-socket type connector structures.

The foregoing detailed description is to be clearly understood as being given by way of illustration and example only, the spirit and scope of the present invention being limited solely by the appended claims.

What is claimed is:

1. A circuit board removal tool comprising:
    a generally inverted U-shaped outer frame structure having a first support plate with opposite side edge portions, a pair of outer side plates secured to and depending from said opposite side edge portions and having lower side edge portions, and a first pair of elongated parallel pressure plates secured to said lower side edge portions in a parallel relationship therewith, said first pair of pressure plates having side edge portions projecting inwardly beyond facing side surfaces of said outer side plates;
    a generally inverted U-shaped inner frame structure having a second support plate with opposite side edge portions, a pair of inner side plates secured to and depending from said opposite side edge portions of said second support plate and having a second pair of elongated parallel pressure plates secured to said lower side edge portions of said inner side plates in a parallel relationship therewith, said second pair of pressure plates having side edge portions projecting inwardly beyond facing side surfaces of said inner side plates, said inner frame structure being received within said outer frame structure and being movable relative thereto between a lowered position in which said second support plate is spaced downwardly apart from said first support plate and said second pair of pressure plates downwardly engage said first pair of pressure plates in a parallel relationship therewith, and a raised position in which said second pair of pressure plates are spaced upwardly apart from said first pair of pressure plates;

spring means for resiliently biasing said inner frame structure toward said lowered position thereof; and force exerting means associated with said inner and outer frame structures and manually operable to releasably move said inner frame structure from said lowered position thereof to said lifted position thereof, said force exerting means including:

an elongated lower handle member having an inner end portion fixedly secured to said first support plate, a vertically movable actuating rod slidably extending through said first support plate, said actuating rod having a lower end fixedly secured to said second support plate, and an upper end disposed above said first support plate, an elongated upper handle member disposed above said lower handle member and having an inner end portion pivotally secured to said upper end of said actuating rod, a support bracket secured to the underside of said upper handle member, and a roller member rotationally carried by said support bracket and rollingly engaging a top side portion of said lower handle member.

2. The circuit board removal tool of claim 1 further comprising:

a resilient pad member secured to the underside of said second support plate.

* * * * *